(12) United States Patent
Wenzel et al.

(10) Patent No.: US 11,876,059 B2
(45) Date of Patent: Jan. 16, 2024

(54) SEMICONDUCTOR DEVICE WITH DIRECTING STRUCTURE AND METHOD THEREFOR

(71) Applicant: NXP USA, INC., Austin, TX (US)

(72) Inventors: Robert Joseph Wenzel, Austin, TX (US); Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 144 days.

(21) Appl. No.: 17/321,630

(22) Filed: May 17, 2021

(65) Prior Publication Data

US 2022/0367389 A1  Nov. 17, 2022

(51) Int. Cl.
| | |
|---|---|
| *H01L 21/48* | (2006.01) |
| *H01L 23/66* | (2006.01) |
| *H01L 23/498* | (2006.01) |
| *H01L 23/00* | (2006.01) |
| *H01Q 1/22* | (2006.01) |
| *G01S 13/931* | (2020.01) |

(52) U.S. Cl.
CPC ............ *H01L 23/66* (2013.01); *H01L 21/486* (2013.01); *H01L 23/49816* (2013.01); *H01L 23/49822* (2013.01); *H01L 23/49838* (2013.01); *H01L 24/16* (2013.01); *H01L 24/73* (2013.01); *H01Q 1/2283* (2013.01); *G01S 13/931* (2013.01); *H01L 2223/6616* (2013.01); *H01L 2223/6677* (2013.01); *H01L 2224/16235* (2013.01); *H01L 2224/73204* (2013.01)

(58) Field of Classification Search
CPC . H01L 23/66; H01L 21/486; H01L 23/49816; H01L 23/49822; H01L 23/49838; H01L 24/16; H01L 24/73; H01L 2223/6616; H01L 2223/6677; H01L 2224/16235; H01L 2224/73204; H01Q 1/2283; H01Q 1/40; H01Q 15/10; H01Q 19/09; G01S 13/931
See application file for complete search history.

(56) References Cited

U.S. PATENT DOCUMENTS

| | | | |
|---|---|---|---|
| 6,801,165 B2 | 10/2004 | Fang | |
| 8,952,521 B2 | 2/2015 | Wojnowski et al. | |
| 9,196,951 B2 | 11/2015 | Baks et al. | |
| 10,615,134 B2 | 4/2020 | Spella et al. | |
| 2010/0193942 A1* | 8/2010 | Railkar | H01L 24/32 257/713 |
| 2016/0049723 A1 | 2/2016 | Baks et al. | |
| 2019/0096829 A1* | 3/2019 | Tang | H01L 21/486 |

(Continued)

OTHER PUBLICATIONS

Gu, X., "Development, Implementation, and Characterization of a 64-Element Dual-Polarized Phased-Array Antenna Module for 28-GHz High-Speed Data Communications", IEEE Transactions on Microwave Theory and Techniques, vol. 67, No. 7, Jul. 2019.

*Primary Examiner* — Elias Ullah
(74) *Attorney, Agent, or Firm* — Robert J. Amedeo

(57) ABSTRACT

A semiconductor device having a radiating element and a directing structure is provided. The semiconductor device includes a device package. A semiconductor die is coupled to the radiating element integrated in the device package. The directing structure is affixed to the device package by way of an adhesive. The directing structure is located over the radiating element and configured for propagation of radio frequency (RF) signals.

20 Claims, 13 Drawing Sheets

(56) References Cited

U.S. PATENT DOCUMENTS

2019/0115646 A1      4/2019  Chiu et al.
2019/0319338 A1     10/2019  Gu et al.
2020/0395681 A1*    12/2020  Ueda ..................... H01Q 23/00

* cited by examiner

SEMICONDUCTOR DEVICE WITH DIRECTING STRUCTURE AND METHOD THEREFOR

BACKGROUND

Field

This disclosure relates generally to semiconductor device packaging, and more specifically, to semiconductor devices with directing structure and method of forming the same.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g., other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a radiating element and a directing structure. The semiconductor device includes a packaged semiconductor die interconnected to the radiating element integrated in the package. The directing structure is affixed over the radiating element by way of an adhesive material. The directing structure is formed as a low cost prefabricated multilayer laminate structure. For example, the directing structure includes a first set of directing elements arranged on a first conductive layer and a second set of directing elements arranged on a second conductive layer separated from the first conductive layer by way of a dielectric material. The radiating element and directing structure together are configured for propagation of radio frequency (RF) signals such as those in the mmWave frequency range (e.g., 30 GHz-300 GHz). Because the directing structure is a prefabricated structure affixed to the package by way of an adhesive, an automated assembly process is employed to further improve reliability, accuracy, and overall device costs.

Figure 1:
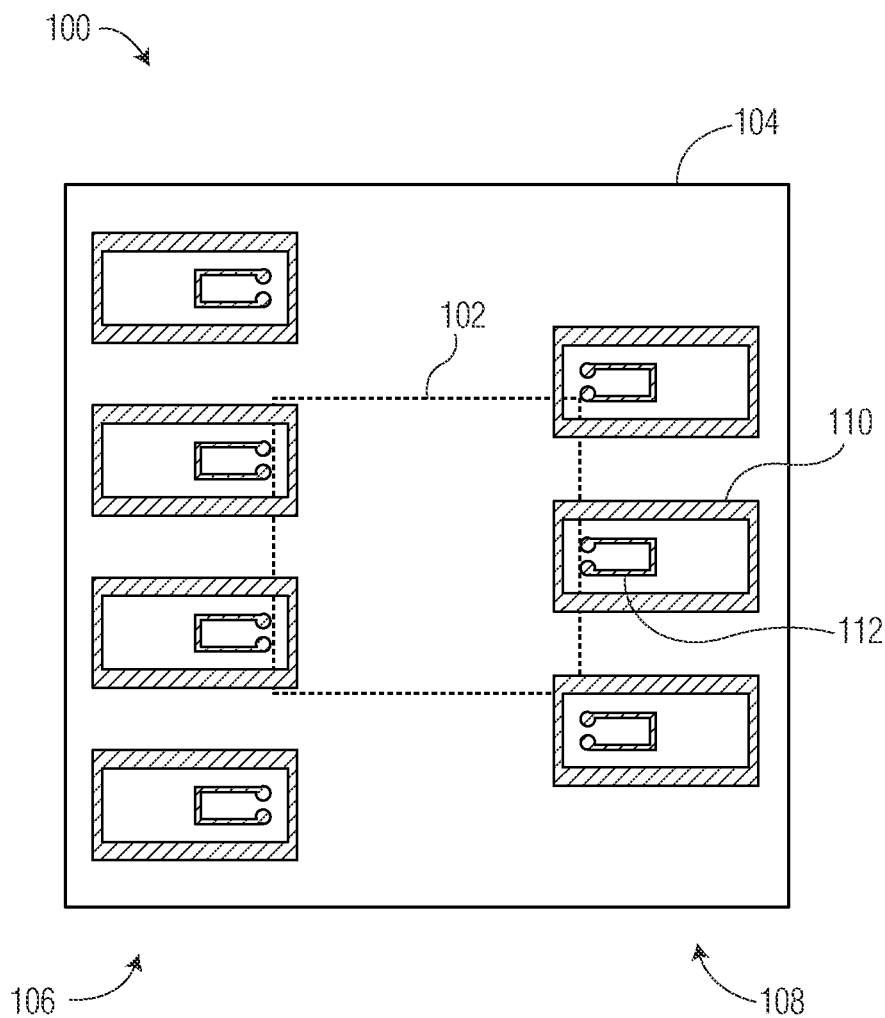
FIG. 1 illustrates, in a simplified top-side-up plan view, an example semiconductor device at a stage of manufacture in accordance with an embodiment.

FIG. 1 illustrates, in a simplified top-side-up plan view, an example semiconductor device 100 at a stage of manufacture in accordance with an embodiment. At this stage of manufacture, the device 100 includes a semiconductor die 102, a package substrate 104, and radiating element structures 106 and 108 integrated in the package substrate 104. In this embodiment, the semiconductor die, depicted as a dashed-outline for reference, is affixed at a bottom side of the package substrate 104. Each of the radiating element structures 106 and 108 include a radiating element 112 and surrounding ring 110 embedded in the package substrate. For illustration purposes, the radiating element structures 106 and 108 are depicted as visible through a top side of the package substrate 104 even though the radiating element structures 106 and 108 are embedded within the package substrate. In this embodiment, the group of radiating element structures 106 may be characterized as receiver (RX) radiating structures and the group of radiating element structures 108 may be characterized as transmitter (TX) radiating structures.

Figure 2:
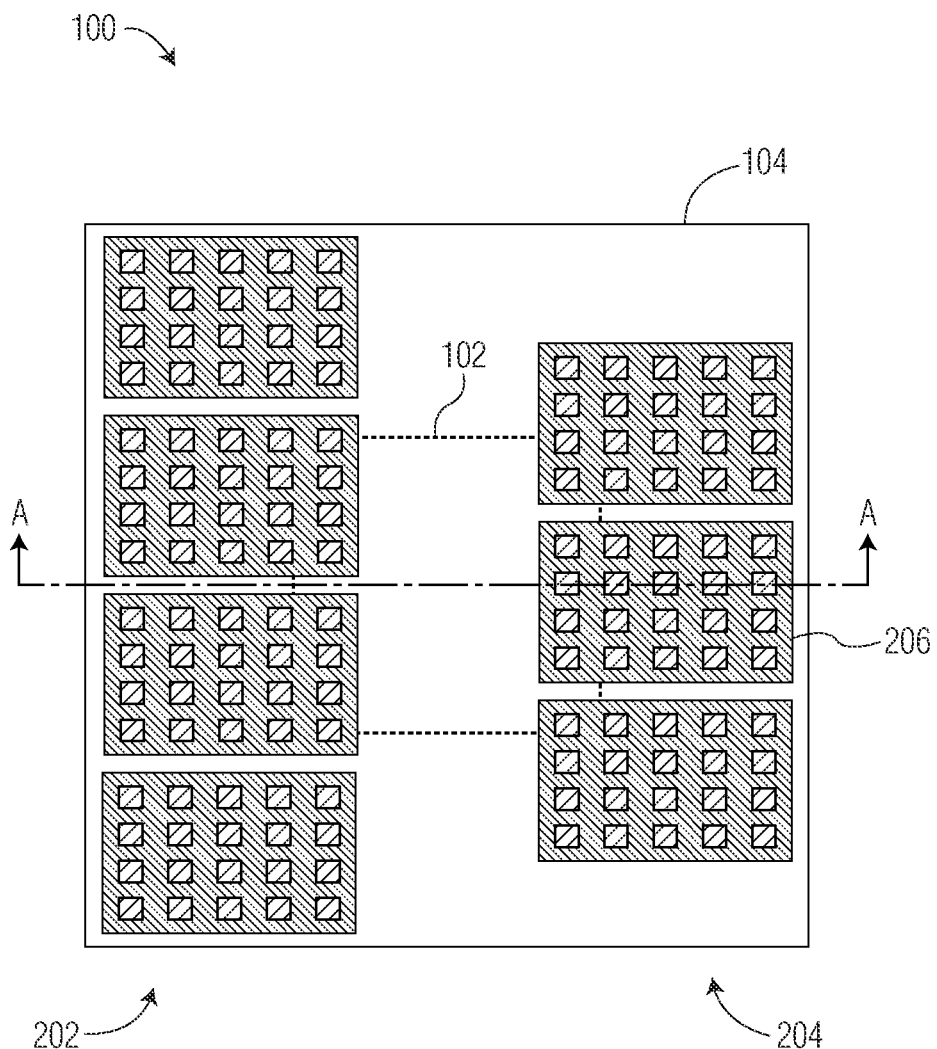
FIG. 2 illustrates, in a simplified top-side-up plan view, the example semiconductor device with a directing structure attached at a subsequent stage of manufacture in accordance with an embodiment.

FIG. 2 illustrates, in a simplified top-side-up plan view, the example semiconductor device 100 at a subsequent stage of manufacture in accordance with an embodiment. At this stage of manufacture, the device 100 includes the semiconductor die 102 affixed at the bottom side of the package substrate 104 and example prefabricated directing structures 206 affixed at a top side of the package substrate 104. Even though the semiconductor die 102 is not visible from the view depicted in FIG. 2, the dashed-outline is provided to indicate the semiconductor die location for reference. In this embodiment, each of the directing structures 206 is affixed over a corresponding radiating element structure (106, 108). For example, the directing structures 206 are arranged in a RX directing structure group 202 and a TX directing structure group 204 corresponding to the radiating element structures 106 and 108 respectively.

FIG. 3 through FIG. 7 illustrate, in simplified top-side-up cross-sectional views, the example semiconductor device 100 taken along line A-A of FIG. 2 at stages of manufacture in accordance with an embodiment. In the embodiments of FIG. 3 through FIG. 7, an example ball grid array (BGA) package type is depicted having a package substrate characterized as a chip scale package (CSP) type package substrate. Even though the embodiments depicted in FIG. 3 through FIG. 7 exemplify BGA type package configurations, embodiments in other package configuration types (e.g., wafer-level packaging) are anticipated by this disclosure.

Figure 3:
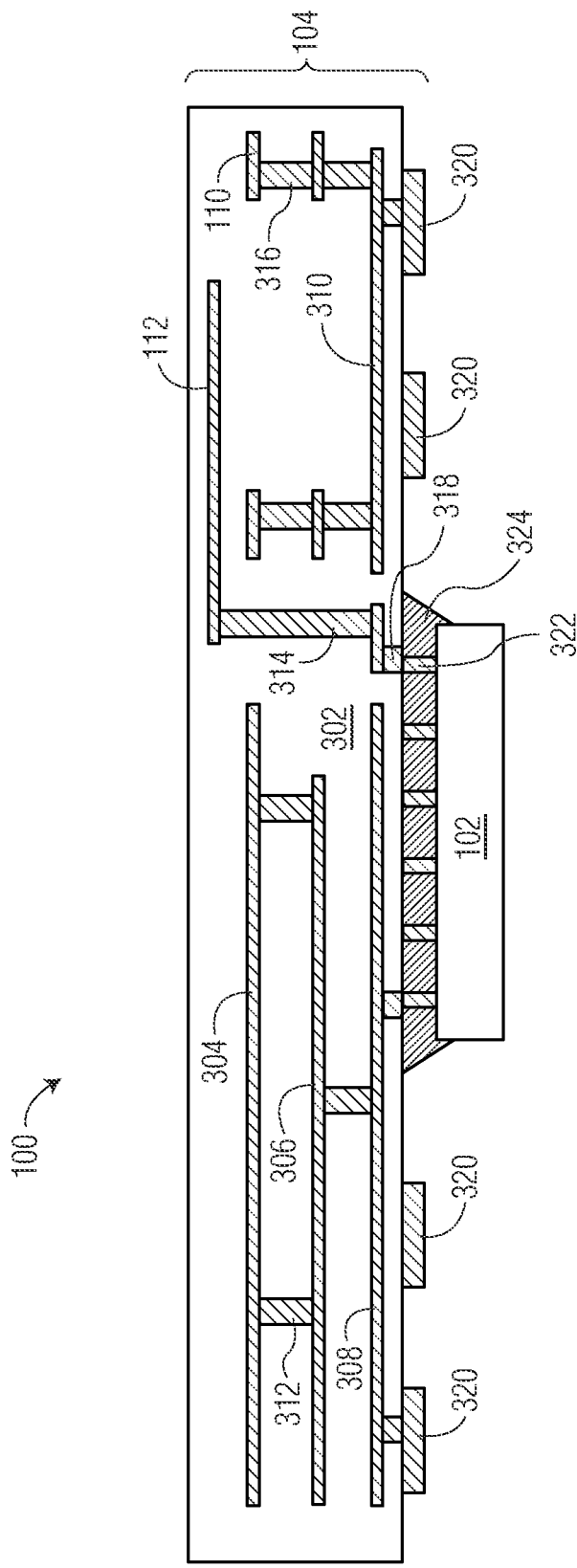
FIG. 3 through FIG. 7 illustrate, in simplified cross-sectional views, the example semiconductor device of FIG. 2 at stages of manufacture in accordance with an embodiment.

FIG. 3 illustrates, in a simplified cross-sectional view, the example semiconductor device 100 taken along line A-A at a stage of manufacture in accordance with an embodiment. At this stage, the device 100 includes the semiconductor die 102 affixed to the package substrate 104. In this embodiment, the semiconductor die 102 affixed at the bottom side of the package substrate 104 by way of conductive die connectors 322 and underfilled with an epoxy material 324. In some embodiments, the semiconductor die 102 may be affixed at the top side of the package substrate 104. The die connectors 322 may be any suitable die connector structure such as solder bumps, gold studs, copper pillars, and the like. Features such as bond pads on the semiconductor die 102 and corresponding pads on the package substrate 104 are not shown for illustration purposes.

The semiconductor die 102 has an active side (e.g., major side having circuitry, bond pads) and a backside (e.g., major side opposite of the active side). In this embodiment, the semiconductor die 102 is configured in a flip-chip orientation having the active side mounted on the bottom side of the package substrate 104. The semiconductor die 102 may be formed from any suitable semiconductor material, such as silicon, germanium, gallium arsenide, gallium nitride, and the like. The semiconductor die 102 may further include any digital circuits, analog circuits, RF circuits, memory, processor, the like, and combinations thereof at the active surface.

The package substrate 104 has a top side and a bottom side (e.g., major side opposite of the top side). In this embodiment, the package substrate 104 is formed as a multilayer laminate structure having conductive (e.g., metal) layers patterned to form traces 110 and 304-308, portion 310, and radiating element 112. The radiating element 112 may be formed as a monopole, loop, patch, or other suitable structure. In this embodiment, the radiating element 112 may be characterized as a signal launcher configured for propagation of radio frequency (RF) signals such as radar, Wi-Fi, UWB, 5G and 6G signals, for example. The conductive layers are separated from each another by a non-conductive material 302 (e.g., FR-4). The package substrate 104 further includes connector pads 320 located at the bottom side and configured for connection to a printed circuit board (PCB) by way of conductive connectors, for example. Contacts 318 and vias 312-316 provide conductive connections between the semiconductor die 102 and the conductive traces 110, 304-308, portion 310, and radiating element 112.

In this embodiment, the semiconductor die 102 is interconnected with the radiating element 112 by way of conductive features of the package substrate 104 such as contact 318 and via 314, for example. The portion 310 is a conductive layer portion located below the radiating element and separated from the radiating element 112 by way of the non-conductive material 302. In this embodiment, the conductive layer portion 310 is configured and arranged to serve as a signal reflector. The package substrate 104 further includes conductive vias 316 and trace 110 configured and arranged to form a vertical conductive structure (e.g., wall, fence) connected around a perimeter of the conductive layer portion 310. The vertical conductive structure configured and arranged to serve as a sidewall of the signal reflector substantially surrounding the radiating element 112. In some embodiments, it may be desirable to connect the conductive layer portion 310 and the vertical conductive structure to a ground supply terminal or other suitable supply terminal.

Figure 4:
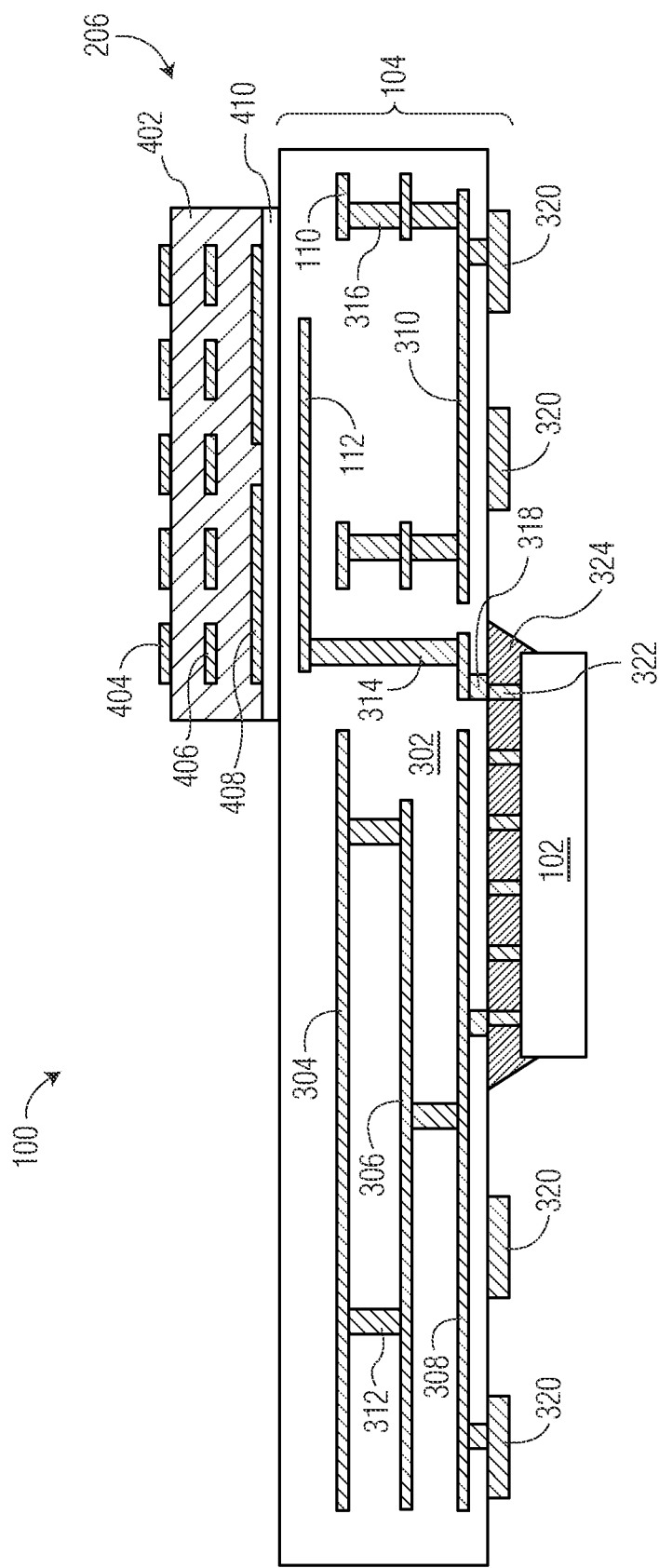

FIG. 4 illustrates, in a simplified cross-sectional view, the example semiconductor device 100 taken along line A-A at a subsequent stage of manufacture in accordance with an embodiment. At this stage of manufacture, the device 100 includes the example directing structure 206 affixed at the top side of the package substrate 104 by way of an adhesive material 410. In this embodiment, the directing structure 206 is positioned over the radiating element 112 and affixed by way of the adhesive material 410.

The adhesive material 410 may be any suitable adhesive (e.g., paste, film) configured for joining electronic components and packaging materials (e.g., die stacking). The adhesive material 410 may be dispensed or applied in a manner suitable for attachment of the directing structure 206 in a process consistent with component pick-and-place assembly processes or automated die attach processes, for example. The adhesive material 410 may be a polymer (e.g., polyimide, epoxy, Teflon) based adhesive in the form of a non-conductive adhesive or a conductive adhesive. For example, a non-conductive adhesive material 410 may be applied across a partial or entire interface between the radiating element 112 and the directing structure 206. Whereas a conductive adhesive material 410 may be applied (e.g., around a perimeter) such that a radiated signal path between the radiating element 112 and the directing structure 206 is not obstructed by the conductive adhesive. Because the directing structure 206 is a prefabricated structure affixed to the package by way of the adhesive material 410, an automated assembly process may be employed for a variety of package types (e.g., ball grid array packaging, wafer-level and strip-level packaging).

In this embodiment, the directing structure 206 is a prefabricated structure and includes a first plurality of directing elements 404 arranged on a first conductive layer, a second plurality of directing elements 406 arranged on a second conductive layer, and a third plurality of directing elements 408 arranged on a third conductive layer. Each of the three conductive layers are separated from each other by way of a dielectric material 402 (e.g., prepreg, epoxy, polyimide, FR-4). The first conductive layer is patterned to form directing elements 404 as an array of conductive (e.g., copper) patches. The number, size, and location of the directing elements 404 are predetermined based on a desired frequency of operation. Likewise, the second conductive layer is patterned to form directing elements 406 as an array of conductive (e.g., copper) patches. The number, size, and location of the directing elements 406 are predetermined based on the desired frequency of operation. The third conductive layer is patterned to form directing elements 408 as a slot in a conductive (e.g., copper) plane. The dimensions of the slot are predetermined based on the desired frequency of operation. In this embodiment, the directing structure 206 is formed as a laminate structure including three conductive layers separated by non-conductive material. In other embodiments, the directing structure 206 may be formed with any suitable number of conductive layers and directing elements. In this embodiment, the directing structure 206 may be characterized as an antenna configured for propagation of RF signals such as radar, Wi-Fi, UWB, 5G and 6G signals, for example. In other embodiments, the directing structure 206 may serve as a coupler configured to receive a radiated signal from the radiating element 112 and propagate the signal by way of a conductive trace to a connector (e.g., for an antenna) at the top surface of the directing structure 206. A simplified example manufacturing flow is depicted in FIG. 10 through FIG. 17.

Figure 5:
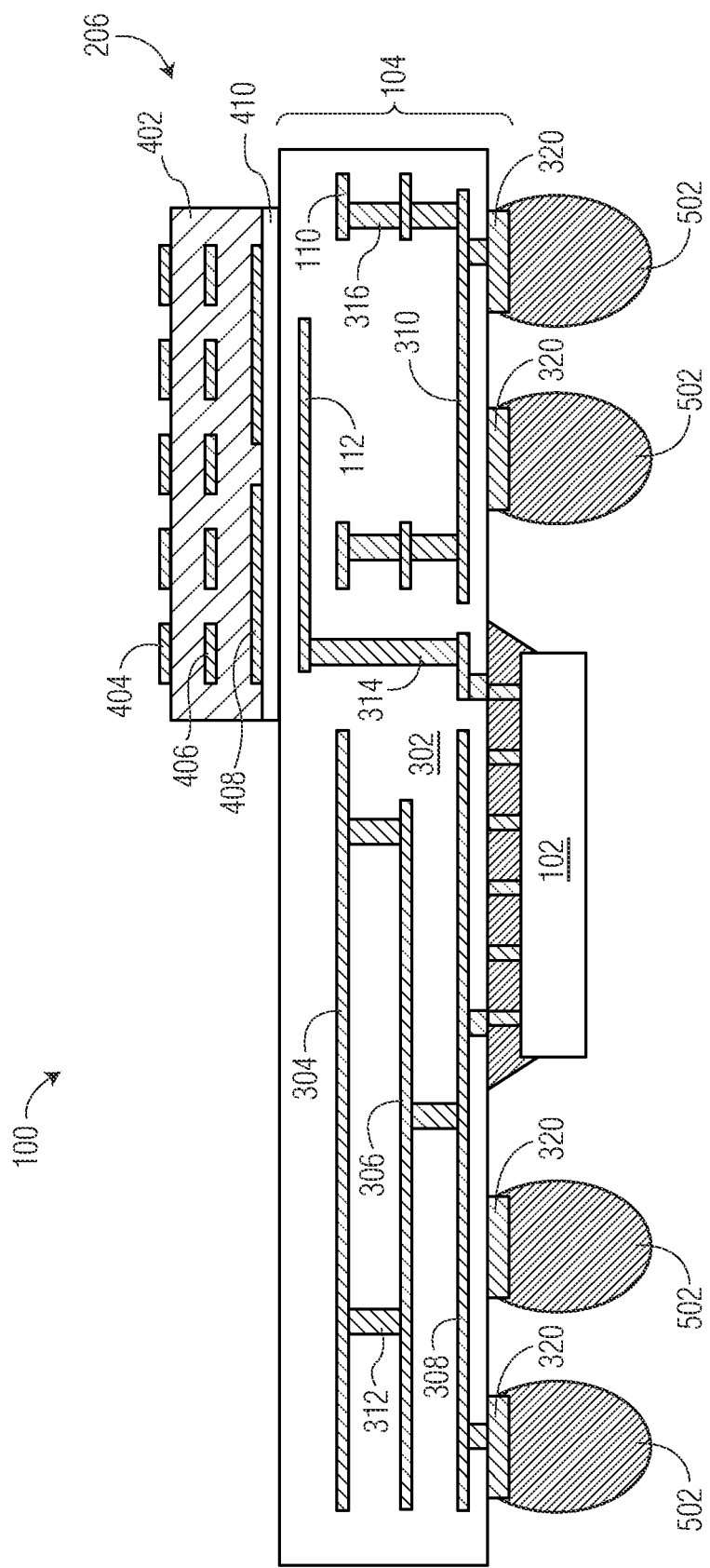

FIG. 5 illustrates, in a simplified cross-sectional view, the example semiconductor device 100 taken along line A-A at a subsequent stage of manufacture in accordance with an embodiment. At this stage of manufacture, the device 100 includes conductive connectors 502 affixed at the bottom side of the package substrate 104. In this embodiment, after the directing structure 206 is affixed at the top side of the package substrate 104, the conductive connectors 502 are affixed to respective connector pads 320 located at the bottom side. In this embodiment, the conductive connectors 502 may be characterized as input/output and power supply connectors coupled to provide input/output signals and power to the semiconductor die 102 by way of the connector pads 320, for example. The conductive connectors 502 may be formed in any suitable conductive connector structures such as solder balls, gold studs, copper pillars, and the like. In this embodiment, the conductive connectors 502 are formed as ball connectors, for example, and arranged in a ball grid array (BGA). After conductive connectors 502 are affixed, individual semiconductor device units may be singulated from a panel or strip in a subsequent manufacturing process, for example.

Figure 6:
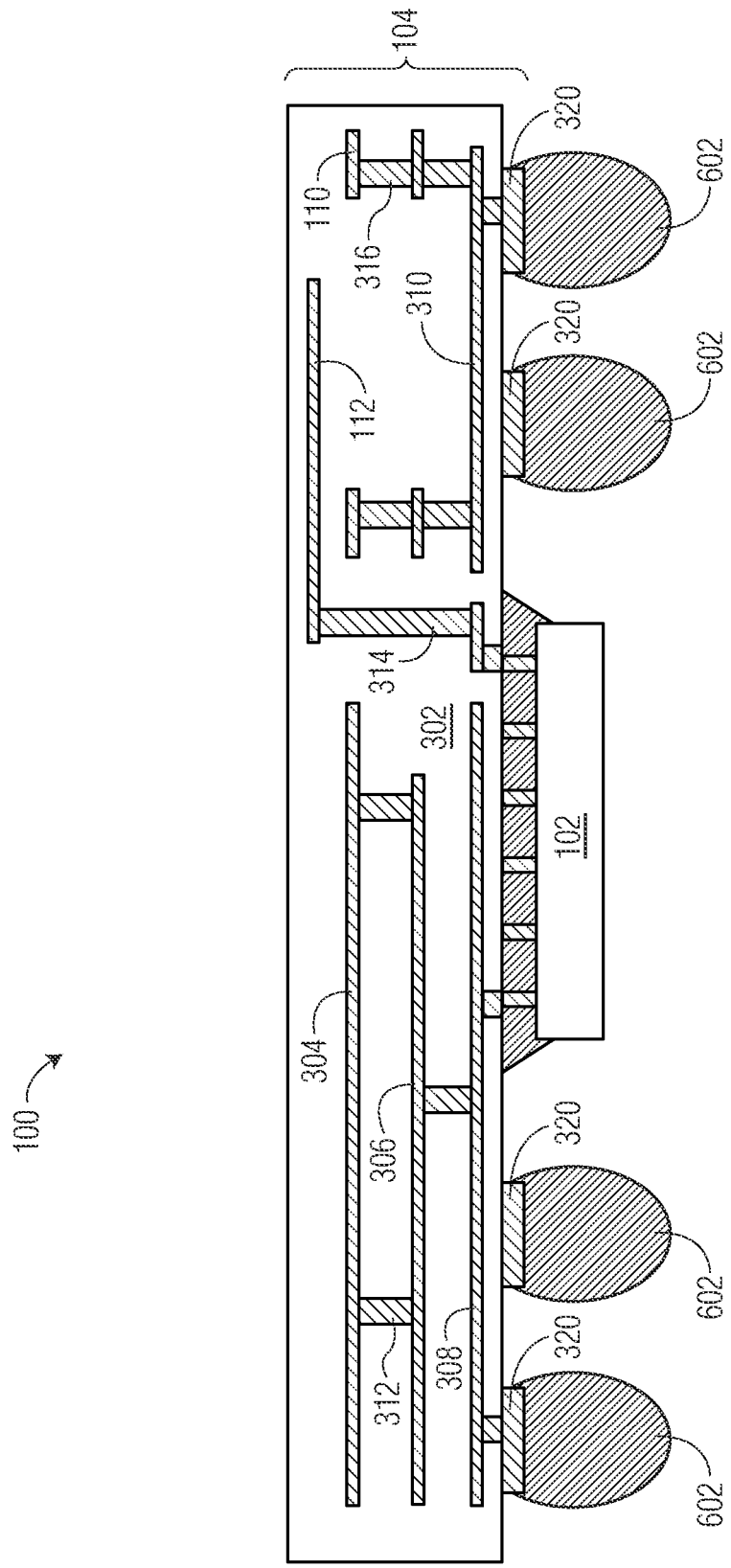
Figure 7:
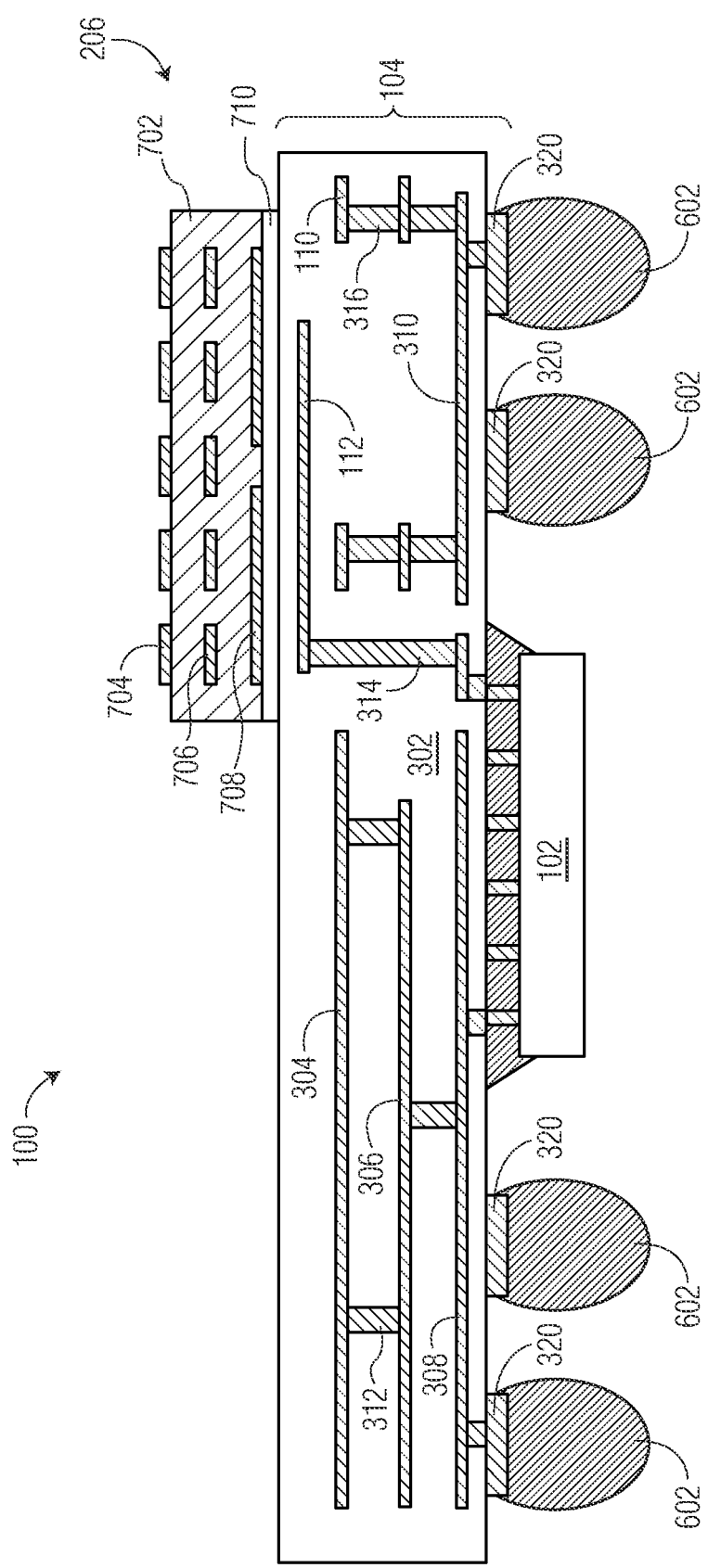

FIG. 6 and FIG. 7 illustrate, in simplified cross-sectional views, the example semiconductor device 100 taken along line A-A at alternative stages of manufacture in accordance with an embodiment. The embodiments depicted in FIG. 6 and FIG. 7 are subsequent to the stage of manufacture depicted in FIG. 3 and are alternatives to the embodiments depicted in FIG. 4 and FIG. 5.

FIG. 6 illustrates, in a simplified cross-sectional view, the example semiconductor device 100 taken along line A-A at an alternative stage of manufacture in accordance with an embodiment. At this stage of manufacture, the device 100 includes conductive connectors 602 affixed at the bottom side of the package substrate 104. In this embodiment, the conductive connectors 602 are affixed to respective connector pads 320 located at the bottom side. In this embodiment, the conductive connectors 602 may be characterized as input/output and power supply connectors coupled to provide input/output signals and power to the semiconductor die 102 by way of the connector pads 320, for example. The conductive connectors 602 may be formed in any suitable conductive connector structures such as solder balls, gold studs, copper pillars, and the like.

FIG. 7 illustrates, in a simplified cross-sectional view, the example semiconductor device 100 taken along line A-A at an alternative stage of manufacture in accordance with an embodiment. At this stage of manufacture, the device 100 includes the example directing structure 206 affixed at the top side of the package substrate 104 by way of an adhesive material 710. In this embodiment, the directing structure 206 is positioned over the radiating element 112 and affixed by way of the adhesive material 710. The adhesive material 710 may be any suitable adhesive (e.g., paste, film) configured for joining electronic components and packaging materials (e.g., die stacking). The adhesive material 710 may be dispensed or applied in a manner suitable for attachment of the directing structure 206 in a process consistent with component pick-and-place assembly processes or automated die attach processes, for example. The adhesive material 710 may be a polymer (e.g., polyimide, epoxy, Teflon) based adhesive in the form of a non-conductive adhesive or a conductive adhesive, for example. After the directing structure 206 is affixed at the top side of the package substrate 104, individual semiconductor device units may be singulated from a panel or strip in a subsequent manufacturing process, for example. In some embodiments, singulated semiconductor device units may be subsequently attached to a PCB before affixing the directing structure 206 at the top side of the package substrate 104.

In this embodiment, the directing structure 206 includes a first plurality of directing elements 704 arranged on a first conductive layer, a second plurality of directing elements 706 arranged on a second conductive layer, and a third plurality of directing elements 708 arranged on a third conductive layer. Each of the three conductive layers are separated from each other by way of a dielectric material 702. The first conductive layer is patterned to form directing elements 704 as an array of conductive (e.g., copper) patches. The number, size, and location of the directing elements 704 are predetermined based on a desired frequency of operation. Likewise, the second conductive layer is patterned to form directing elements 706 as an array of conductive (e.g., copper) patches. The number, size, and location of the directing elements 706 are predetermined based on the desired frequency of operation. The third conductive layer is patterned to form directing elements 708 as a slot in a conductive (e.g., copper) plane. The dimensions of the slot are predetermined based on the desired frequency of operation. In this embodiment, the directing structure 206 is formed as a laminate structure including three conductive layers separated by non-conductive material. In other embodiments, the directing structure 206 may be formed with any suitable number of conductive layers and directing elements.

Figure 8:
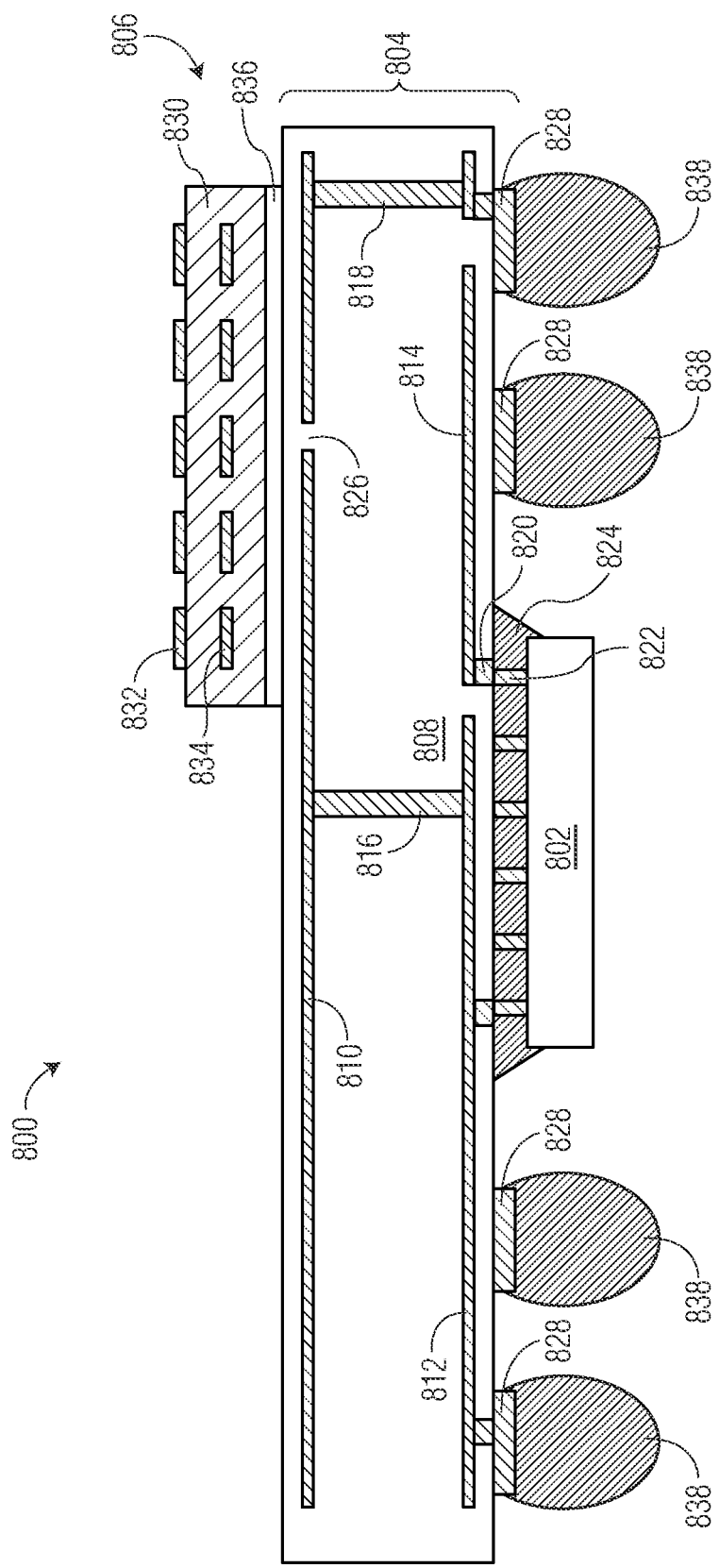
FIG. 8 illustrates, in a simplified cross-sectional view, an alternative example semiconductor device with a directing structure attached at a stage of manufacture in accordance with an embodiment.

FIG. 8 illustrates, in a simplified cross-sectional view, an alternative example semiconductor device 800 with a directing structure 806 attached at a stage of manufacture in accordance with an embodiment. At this stage, the device 800 includes a semiconductor die 802 affixed at a bottom side of a package substrate 804 and a directing structure 806 affixed at a top side of the package substrate 804. The semiconductor die 802 is affixed at a bottom side of a package substrate 804 by way of conductive die connectors 822 and underfilled with an epoxy material 824. The die connectors 822 may be any suitable die connector structure such as solder bumps, gold studs, copper pillars, and the like. Features such as bond pads on the semiconductor die 802 and corresponding pads on the package substrate 804 are not shown for illustration purposes.

The semiconductor die 802 has an active side (e.g., major side having circuitry, bond pads) and a backside (e.g., major side opposite of the active side). In this embodiment, the semiconductor die 802 is configured in a flip-chip orientation having the active side mounted on the bottom side of the package substrate 104. The semiconductor die 802 may be formed from any suitable semiconductor material, such as silicon, germanium, gallium arsenide, gallium nitride, and the like. The semiconductor die 802 may further include any digital circuits, analog circuits, RF circuits, memory, processor, the like, and combinations thereof at the active surface.

The package substrate 804 has a top side and a bottom side (e.g., major side opposite of the top side). In this embodiment, the package substrate 804 is formed as a multilayer laminate structure having conductive (e.g., metal) layers patterned to form traces 810-812, slot 826, and radiating element 814. The conductive layers are separated from each another by way of a non-conductive material 808. The package substrate 104 further includes connector pads 828 located at the bottom side. Conductive connectors 838 are affixed to respective connector pads 828 located at the bottom side and configured for connection to a PCB, for example. The conductive connectors 838 may be formed in any suitable conductive connector structures such as solder balls, gold studs, copper pillars, and the like. Contacts 820 and vias 816-818 provide conductive connections between the semiconductor die 802 and the conductive traces 810-812 and radiating element 814, for example.

The radiating element 814 is interconnected with the semiconductor die 802 by way of contact 820 in this embodiment. The radiating element 814 may be formed as a monopole, loop, patch, or other suitable structure. In this embodiment, the radiating element 814 may be characterized as a signal launcher configured for propagation of RF signals. In this embodiment, the radiating element 814 and the slot 826 are formed in separate conductive layers (e.g., copper) of the package substrate 804. The slot 826 formed in a predetermined location over the radiating element 814. The slot 826 may serve as an antenna when RF signals are propagated. The dimensions of the slot are predetermined based on a desired frequency of operation.

The directing structure 806 is affixed at a top side of the package substrate 804 by way of an adhesive. In this embodiment, the directing structure 806 is positioned over the slot 826 and affixed by way of the adhesive material 836. The adhesive material 836 may be any suitable adhesive configured for joining electronic components and packaging materials. The adhesive material 836 may be dispensed or applied in a manner suitable for attachment of the directing structure 806 in a process consistent with component pick-and-place assembly processes or automated die attach processes, for example.

In this embodiment, the directing structure 806 includes a first plurality of directing elements 832 arranged on a first conductive layer and a second plurality of directing elements 834 arranged on a second conductive layer separated from the first conductive layer by way of a dielectric material 830. The first conductive layer is patterned to form directing elements 832 as an array of conductive (e.g., copper) patches. The number, size, and location of the directing elements 832 are predetermined based on the desired frequency of operation. Likewise, the second conductive layer is patterned to form directing elements 834 as an array of conductive (e.g., copper) patches. The number, size, and location of the directing elements 834 are predetermined based on the desired frequency of operation. In this embodiment, the directing structure 806 may be characterized as an antenna configured for propagation of RF signals such as radar, Wi-Fi, UWB, 5G and 6G signals, for example.

Figure 9:
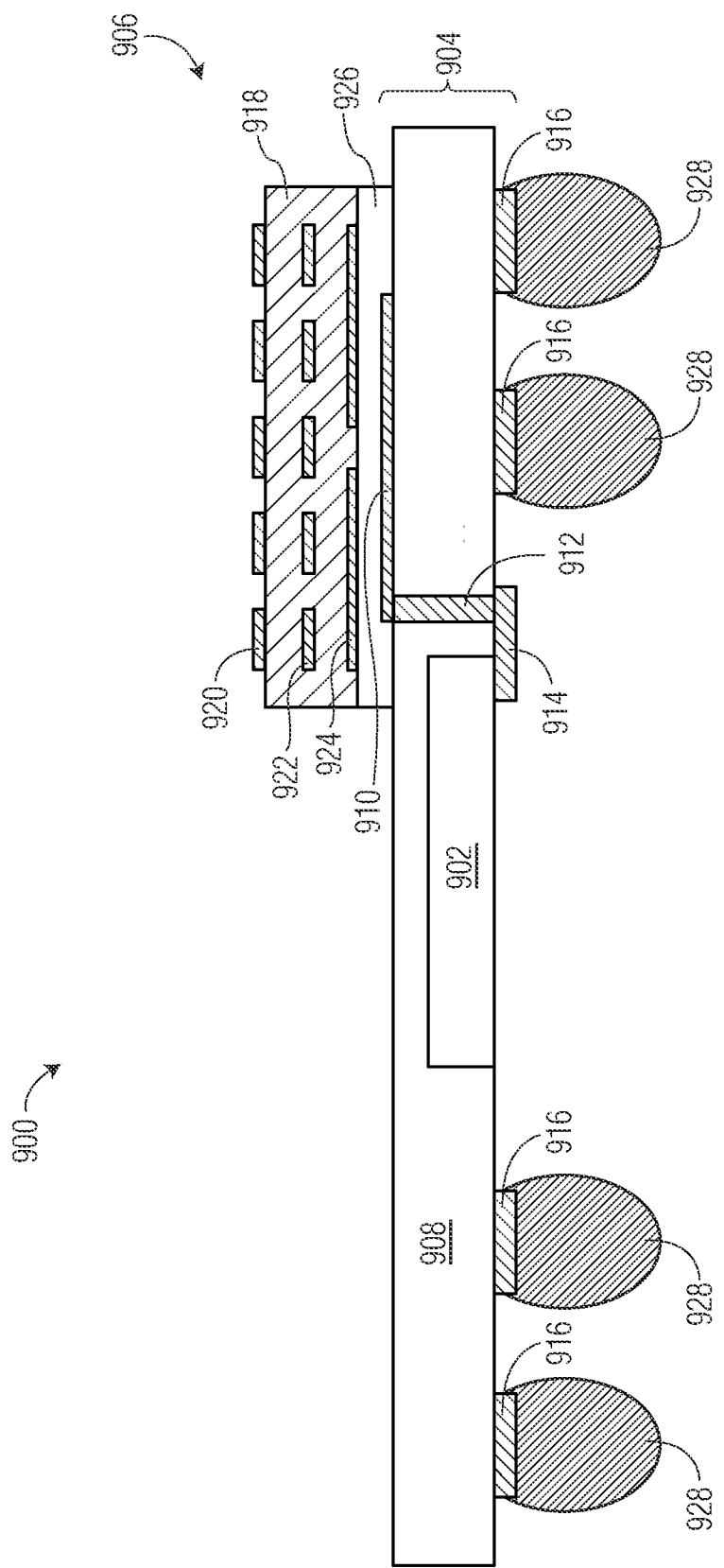
FIG. 9 illustrates, in a simplified cross-sectional view, an alternative example semiconductor device with a directing structure attached at a stage of manufacture in accordance with an embodiment.

FIG. 9 illustrates, in a simplified cross-sectional view, an alternative example semiconductor device 900 with a directing structure 906 attached at a stage of manufacture in accordance with an embodiment. At this stage, the device 900 includes a semiconductor die 902 encapsulated with an encapsulant 908 (e.g., epoxy) and the directing structure 906 affixed at a top side of the encapsulant 908. A redistribution layer (RDL) including conductive trace 914 and connector pads 916 is formed at a bottom side of the encapsulant 908 and exposed side of the semiconductor die 902. In the embodiment of FIG. 9, an example fan-out wafer-level package (FOWLP) type is depicted. A conductive (e.g., copper) radiating element 910 is formed at the top side of the encapsulant 908. Conductive connectors 928 are affixed to respective connector pads 916 located at the bottom side and configured for connection to a PCB, for example. The conductive connectors 928 may be formed in any suitable conductive connector structures such as solder balls, gold studs, copper pillars, and the like.

The semiconductor die 902 has an active side (e.g., major side having circuitry, bond pads) and a backside (e.g., major side opposite of the active side). In this embodiment, the semiconductor die 902 is configured in the active side exposed at the bottom side of the encapsulant 908. The semiconductor die 902 may be formed from any suitable semiconductor material, such as silicon, germanium, gallium arsenide, gallium nitride, and the like. The semiconductor die 902 may further include any digital circuits, analog circuits, RF circuits, memory, processor, the like, and combinations thereof at the active surface. Features such as bond pads on the semiconductor die 902 are not shown for illustration purposes.

The radiating element 910 is interconnected with the semiconductor die 902 by way of the trace 914 and a through-package via 912, in this embodiment. The radiating element 910 may be formed as a monopole, loop, patch, or other suitable structure. The radiating element 910 shape and dimensions are predetermined based on a desired frequency of operation. In this embodiment, the radiating element 910 may be characterized as a signal launcher configured for propagation of RF signals such as radar, Wi-Fi, UWB, 5G and 6G signals, for example.

The directing structure 906 is affixed at the top side of the encapsulant 908 by way of an adhesive. In this embodiment, the directing structure 906 is positioned over the radiating element 910 and affixed by way of the adhesive material 926. The adhesive material 926 may be any suitable adhesive configured for joining electronic components and packaging materials. The adhesive material 926 may be dispensed or applied in a manner suitable for attachment of the directing structure 906 in a process consistent with component pick-and-place assembly processes or automated die attach processes, for example.

In this embodiment, the directing structure 906 includes a first plurality of directing elements 920 arranged on a first conductive layer, a second plurality of directing elements 922 arranged on a second conductive layer, and a third plurality of directing elements 924 arranged on a third conductive layer. Each of the three conductive layers are separated from each other by way of a dielectric material 918. The first conductive layer is patterned to form directing elements 920 as an array of conductive (e.g., copper) patches. The number, size, and location of the directing elements 920 are predetermined based on a desired frequency of operation. Likewise, the second conductive layer is patterned to form directing elements 922 as an array of conductive (e.g., copper) patches. The number, size, and location of the directing elements 922 are predetermined based on the desired frequency of operation. The third conductive layer is patterned to form directing elements 924 as a slot in a conductive (e.g., copper) plane. The dimensions of the slot are predetermined based on the desired frequency of operation. In this embodiment, the directing structure 906 is formed as a laminate structure including three conductive layers separated by non-conductive material. In other embodiments, the directing structure 909 may be formed with any suitable number of conductive layers and directing elements. In this embodiment, the directing structure 906 may be characterized as an antenna configured for propagation of RF signals such as radar, Wi-Fi, UWB, 5G and 6G signals, for example.

FIG. 10 through FIG. 17 illustrate, in simplified cross-sectional views, an example directing structure 1000 at stages of manufacture in accordance with an embodiment. In this embodiment, the directing structure 1000 is formed as a laminate structure including three conductive layers separated by non-conductive material layers. In other embodiments, the directing structure 1000 may be formed with other suitable number of conductive layers.

Figure 10:
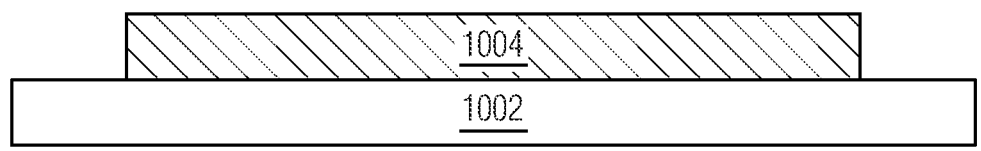
FIG. 10 through FIG. 17 illustrate, in simplified cross-sectional views, an example directing structure at stages of manufacture in accordance with an embodiment.

FIG. 10 illustrates, in a simplified cross-sectional view, the example directing structure 1000 at a stage of manufacture in accordance with an embodiment. At this stage, the directing structure 1000 includes a first non-conductive layer 1004 formed on a carrier substrate 1002. The first non-conductive layer may be characterized as a dielectric material such as prepeg, epoxy, polyimide, and the like, for example.

Figure 11:
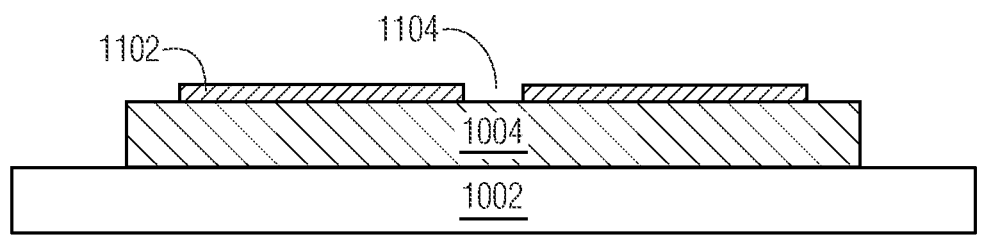

FIG. 11 illustrates, in a simplified cross-sectional view, the example directing structure 1000 at a subsequent stage of manufacture in accordance with an embodiment. At this stage, a first conductive layer is formed on the first non-conducting layer 1004. In this embodiment, after forming the first non-conductive layer 1004, the first conductive layer is deposited and patterned to form directing elements 1102 as a slot 1104 formed in a conductive (e.g., copper) plane. The slot 1104 may be configured as an antenna for propagation of RF signals. The dimensions of the slot may be chosen based on a desired frequency of operation, for example.

Figure 12:
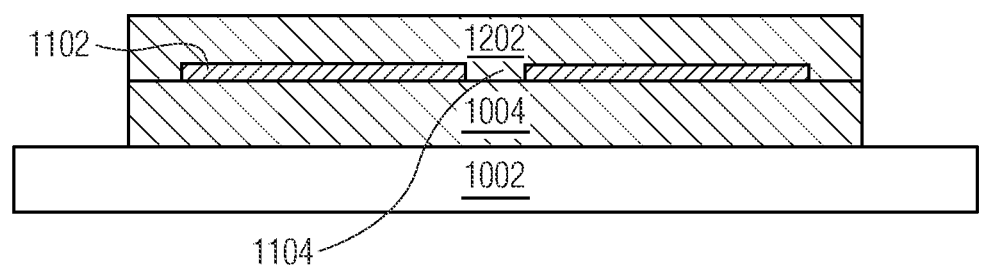

FIG. 12 illustrates, in a simplified cross-sectional view, the example directing structure 1000 at a subsequent stage of manufacture in accordance with an embodiment. At this stage, the directing structure 1000 includes a second non-conductive layer 1202 formed over the directing elements 1102 and slot 1104. The second non-conductive layer may be characterized as a dielectric material formed from a similar material as the first non-conducting layer 1004, for example.

Figure 13:
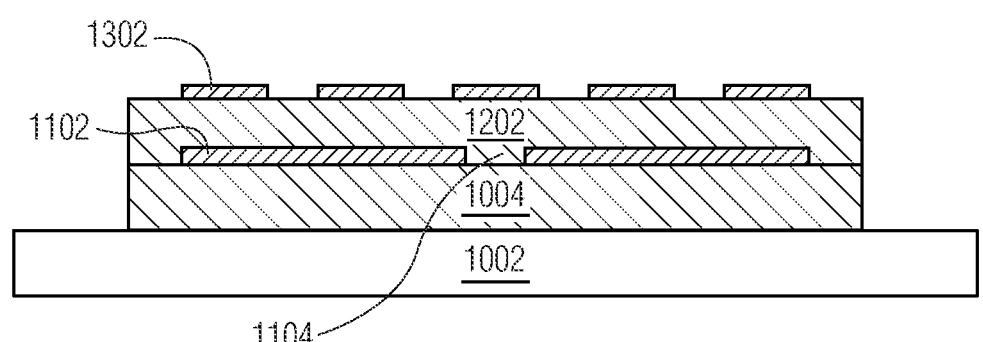

FIG. 13 illustrates, in a simplified cross-sectional view, the example directing structure 1000 at a subsequent stage of manufacture in accordance with an embodiment. At this stage, a second conductive layer is formed on the second non-conducting layer 1202. In this embodiment, after forming the second non-conductive layer 1202, the second conductive layer is deposited and patterned to form directing elements 1302 as an array of conductive (e.g., copper) patches. The directing elements 1302 may be configured as an artificial dielectric layer for propagation of RF signals. The number, size, and location of the directing elements 1302 may be chosen based on the desired frequency of operation, for example.

Figure 14:
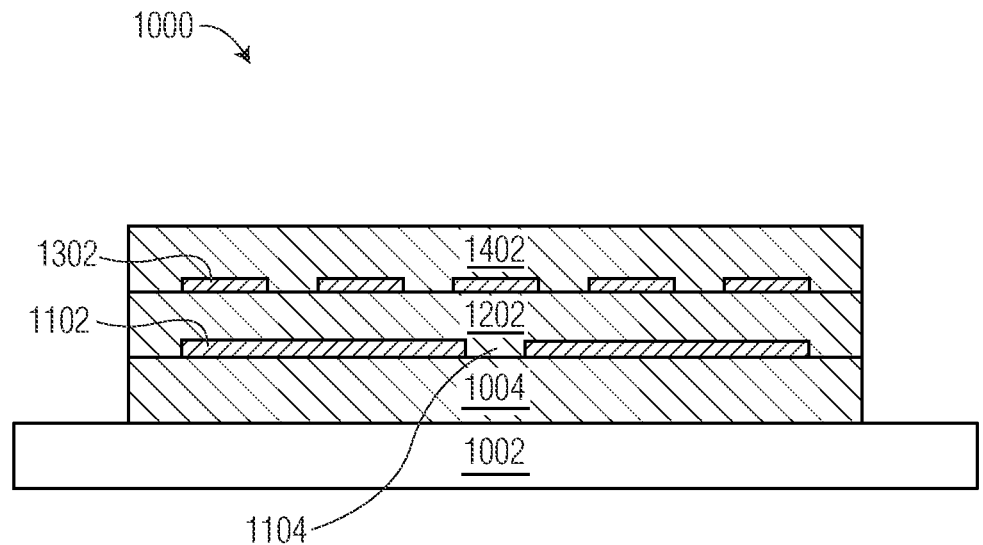

FIG. 14 illustrates, in a simplified cross-sectional view, the example directing structure 1000 at a subsequent stage of manufacture in accordance with an embodiment. At this stage, the directing structure 1000 includes a third non-conductive layer 1402 formed over the directing elements 1302. The third non-conductive layer may be characterized as a dielectric material formed from a similar material as the first and second non-conducting layers 1004 and 1202, for example.

Figure 15:
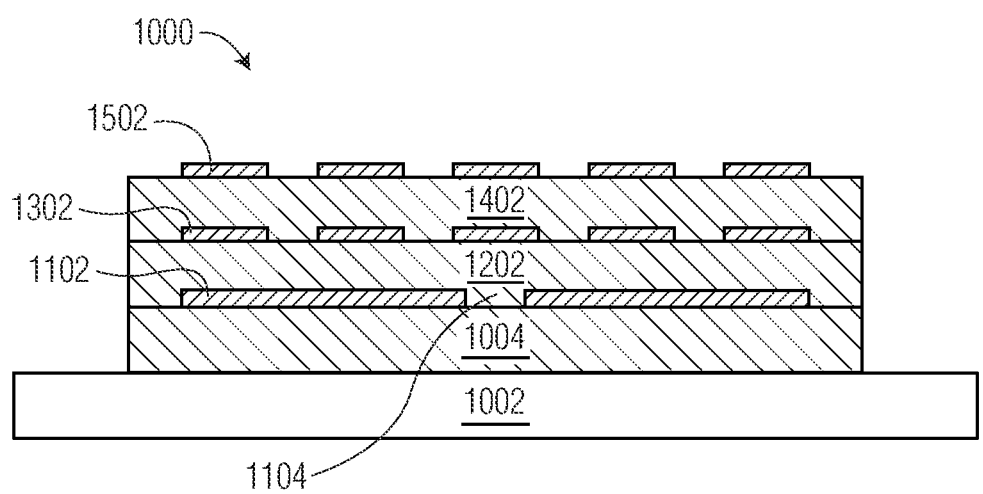

FIG. 15 illustrates, in a simplified cross-sectional view, the example directing structure 1000 at a subsequent stage of manufacture in accordance with an embodiment. At this stage, a third conductive layer is formed on the third non-conducting layer 1402. In this embodiment, after forming the third non-conductive layer 1402, the third conductive layer is deposited and patterned to form directing elements 1502 as an array of conductive (e.g., copper) patches. The directing elements 1502 may be configured as an artificial dielectric layer for propagation of RF signals. The number, size, and location of the directing elements 1502 may be chosen based on the desired frequency of operation, for example.

Figure 16:
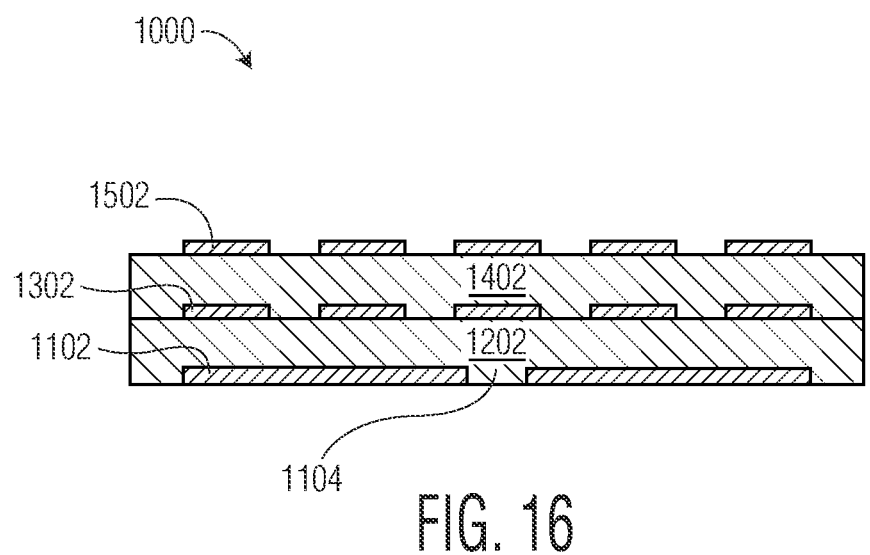

FIG. 16 illustrates, in a simplified cross-sectional view, the example directing structure 1000 at a subsequent stage of manufacture in accordance with an embodiment. At this stage, the carrier substrate 1002 and the first non-conducting layer 1004 are removed. In this embodiment, after forming the directing elements 1502, the carrier substrate 1002 is removed. The first non-conducting layer 1004 is removed after the carrier substrate 1002 is removed. After the carrier substrate 1002 and the first non-conducting layer 1004 are removed, individual directing structure units may be singulated from a panel or strip in a subsequent manufacturing process, for example. At this stage, the singulated directing structure 1000 may be supplied or provided as a prefabricated directing structure. At a subsequent stage, the directing structure 1000 may be affixed to a semiconductor device package by way of an adhesive. In this embodiment, the directing structure 1000 may be characterized as an antenna configured for propagation of RF signals such as radar, Wi-Fi, UWB, 5G and 6G signals, for example.

Figure 17:
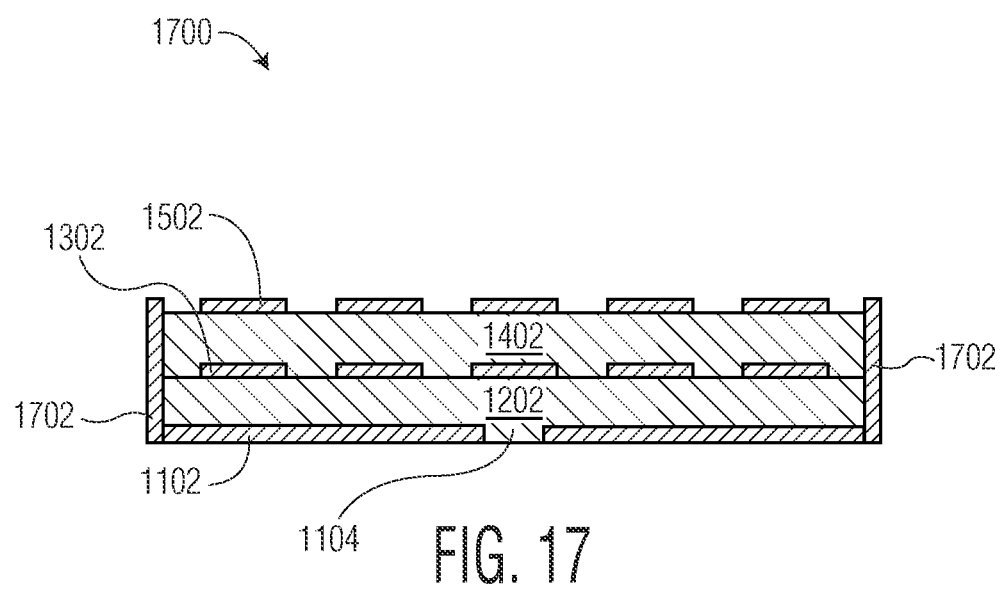

FIG. 17 illustrates, in a simplified cross-sectional view, the example directing structure 1700 at a subsequent stage of manufacture in accordance with an embodiment. At this stage, a conductive (e.g., copper) vertical sidewall 1702 is formed around an outer perimeter of the directing structure 1700. In this embodiment, the vertical sidewall 1702 is configured to provide shielding and noise isolation from adjacent directing structures or other sources, for example. At this stage, the singulated directing structure 1700 may be supplied or provided as a prefabricated directing structure. At a subsequent stage, the directing structure 1700 may be affixed to a semiconductor device package by way of an adhesive. In this embodiment, the directing structure 1700 may be characterized as an antenna configured for propagation of RF signals such as radar, Wi-Fi, UWB, 5G and 6G signals, for example.

Generally, there is provided, a semiconductor device including a device package including a semiconductor die coupled to a radiating element, the radiating element integrated in the device package; and a directing structure affixed to the device package by way of an adhesive, the directing structure located over the radiating element and configured for propagation of radio frequency (RF) signals. The directing structure may include a first plurality of directing elements arranged on a first conductive layer and a second plurality of directing elements arranged on a second conductive layer separated from the first conductive layer by way of a dielectric material. The device package may further include a package substrate, the radiating element embedded in the package substrate and located proximate the directing structure. The package substrate may include a conductive layer portion configured and arranged to serve as a signal reflector, the conductive layer portion located below the radiating element and separated from the radiating element by way of a non-conductive material. The package substrate may further include a vertical conductive structure connected around a perimeter of the conductive layer portion, the vertical conductive structure configured and arranged to serve as a sidewall of the signal reflector. The semiconductor die may be affixed to the package substrate and interconnected to the radiating element by way of conductive structures of the package substrate. The device package may further include an encapsulant encapsulating portions of the semiconductor die, the radiating element integrated at a top surface of the encapsulant. The semiconductor die may be interconnected to the radiating element by way of through-package via and a redistribution layer formed at a bottom surface of the device package. The radiating element may be characterized as a launcher and the directing structure may be characterized as an antenna, the launcher and antenna configured for propagation of RF signals characterized as mmWave signals.

In another embodiment, there is provided, a method including forming a device package including a semiconductor die coupled to a radiating element integrated in the device package; and affixing a directing structure to the device package by way of an adhesive, the directing structure located over the radiating element and configured for propagation of radio frequency (RF) signals. Forming the device package may further include providing a package substrate having the radiating element embedded in the package substrate and located proximate the directing structure. The package substrate may include a conductive layer portion configured and arranged to serve as a signal reflector, the conductive layer portion located below the radiating element and separated from the radiating element by way of a non-conductive material. The semiconductor die may be affixed to the package substrate and interconnected to the radiating element by way of conductive structures of the package substrate. Forming the device package may further include encapsulating portions of the semiconductor die with an encapsulant, the radiating element integrated at a top surface of the encapsulant. Forming the device package may further include forming a redistribution layer at a bottom surface of the device package and interconnecting the semiconductor die to the radiating element utilizing a conductive trace of the redistribution layer. The radiating element may be characterized as a launcher and the directing structure may be characterized as an antenna, the launcher and antenna configured for propagation of RF signals characterized as mmWave signals.

In yet another embodiment, there is provided, a semiconductor device including a package substrate; a radiating element formed from a conductive layer of the package substrate; a semiconductor die affixed to the package substrate and interconnected to the radiating element; and a directing structure affixed to the package substrate by way of an adhesive, the directing structure located over the radiating element and configured for propagation of radio frequency (RF) signals. The directing structure may include a first plurality of directing elements arranged on a first conductive layer and a second plurality of directing elements arranged on a second conductive layer separated from the first conductive layer by way of a dielectric material. The package substrate may include a conductive layer portion configured and arranged to serve as a signal reflector, the conductive layer portion located below the radiating element and separated from the radiating element by way of a non-conductive material. The semiconductor device may further include a plurality of conductive connectors affixed to the package substrate, the plurality of conductive connectors configured for connection to a printed circuit board.

By now, it should be appreciated that there has been provided a semiconductor device having a radiating element and a directing structure. The semiconductor device includes a packaged semiconductor die interconnected to the radiating element integrated in the package. The directing structure is affixed over the radiating element by way of an adhesive material. The directing structure is formed as a low cost prefabricated multilayer laminate structure. For example, the directing structure includes a first set of directing elements arranged on a first conductive layer and a second set of directing elements arranged on a second conductive layer separated from the first conductive layer by way of a dielectric material. The radiating element and directing structure together are configured for propagation of radio frequency (RF) signals such as those in the mmWave frequency range (e.g., 30 GHz-300 GHz). Because the directing structure is a prefabricated structure affixed to the package by way of an adhesive, an automated assembly process is employed to further improve reliability, accuracy, and overall device costs.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a device package including a semiconductor die coupled to a radiating element, the radiating element integrated in the device package; and
    a directing structure placed on a top surface of the device package and affixed to the top surface of the device package by way of an adhesive, the directing structure located directly over the radiating element and not connected to the radiating element, the directing structure configured for propagation of radio frequency (RF) signals.

2. The semiconductor device of claim 1, wherein the directing structure includes a first plurality of directing elements arranged on a first conductive layer and a second plurality of directing elements arranged on a second conductive layer separated from the first conductive layer by way of a dielectric material.

3. The semiconductor device of claim 1, wherein the device package further includes a package substrate, the radiating element embedded in the package substrate and located proximate the directing structure.

4. The semiconductor device of claim 3, wherein the package substrate includes a conductive layer portion configured and arranged to serve as a signal reflector, the conductive layer portion located below the radiating element and separated from the radiating element by way of a non-conductive material.

5. The semiconductor device of claim 4, wherein the package substrate further includes a vertical conductive structure connected around a perimeter of the conductive layer portion, the vertical conductive structure configured and arranged to serve as a sidewall of the signal reflector.

6. The semiconductor device of claim 3, wherein the semiconductor die is affixed to the package substrate and interconnected to the radiating element by way of conductive structures of the package substrate.

7. The semiconductor device of claim 6, wherein the semiconductor die is interconnected to the radiating element by way of through-package via and a redistribution layer formed at a bottom surface of the device package.

8. The semiconductor device of claim 6, wherein the radiating element is characterized as a launcher and the directing structure is characterized as an antenna, the launcher and antenna configured for propagation of RF signals characterized as mmWave signals.

9. The semiconductor device of claim 1, wherein the device package further includes an encapsulant encapsulating portions of the semiconductor die, the radiating element integrated at a top surface of the encapsulant.

10. A method comprising:
forming a device package including a semiconductor die coupled to a radiating element integrated in the device package;
placing a directing structure on a top surface of the device package; and
affixing the directing structure to the top surface of the device package by way of an adhesive, the directing structure located directly over the radiating element and not conductively connected to the radiating element, the directing structure configured for propagation of radio frequency (RF) signals.

11. The method of claim 10, wherein forming the device package further includes providing a package substrate having the radiating element embedded in the package substrate and located proximate the directing structure.

12. The method of claim 11, wherein the package substrate includes a conductive layer portion configured and arranged to serve as a signal reflector, the conductive layer portion located below the radiating element and separated from the radiating element by way of a non-conductive material.

13. The method of claim 11, wherein the semiconductor die is affixed to the package substrate and interconnected to the radiating element by way of conductive structures of the package substrate.

14. The method of claim 10, wherein forming the device package further includes encapsulating portions of the semiconductor die with an encapsulant, the radiating element integrated at a top surface of the encapsulant.

15. The method of claim 14, wherein forming the device package further includes forming a redistribution layer at a bottom surface of the device package and interconnecting the semiconductor die to the radiating element utilizing a conductive trace of the redistribution layer.

16. The method of claim 10, wherein the radiating element is characterized as a launcher and the directing structure is characterized as an antenna, the launcher and antenna configured for propagation of RF signals characterized as mmWave signals.

17. A semiconductor device comprising:
a package substrate;
a radiating element formed from a conductive layer of the package substrate;
a semiconductor die affixed to the package substrate and interconnected to the radiating element; and
a directing structure placed on a top surface of the device package and affixed to the top surface of the package substrate by way of an adhesive, the directing structure located directly over the radiating element and electrically isolated from the radiating element, the directing structure configured for propagation of radio frequency (RF) signals.

18. The semiconductor device of claim 17, wherein the directing structure includes a first plurality of directing elements arranged on a first conductive layer and a second plurality of directing elements arranged on a second conductive layer separated from the first conductive layer by way of a dielectric material.

19. The semiconductor device of claim 17, wherein the package substrate includes a conductive layer portion configured and arranged to serve as a signal reflector, the conductive layer portion located below the radiating element and separated from the radiating element by way of a non-conductive material.

20. The semiconductor device of claim 17, further comprising a plurality of conductive connectors affixed to the package substrate, the plurality of conductive connectors configured for connection to a printed circuit board.

* * * * *